United States Patent [19]
Sakurai

[11] Patent Number: 5,619,328
[45] Date of Patent: Apr. 8, 1997

[54] COMPONENT MOUNTER AND RECOGNITION METHOD

[75] Inventor: Hiroshi Sakurai, Iwata, Japan

[73] Assignee: Yamaha Hatsudoki Kabushiki Kaisha, Iwata, Japan

[21] Appl. No.: 363,682

[22] Filed: Dec. 23, 1994

[30] Foreign Application Priority Data

Dec. 27, 1993 [JP] Japan .................. 5-331221

[51] Int. Cl.⁶ .................. G01B 11/00
[52] U.S. Cl. .................. 356/375; 356/385
[58] Field of Search .................. 356/375, 383, 356/384, 385; 29/720, 721, 740, 741, 759; 348/87

[56] References Cited

U.S. PATENT DOCUMENTS

| | | |
|---|---|---|
| 3,337,941 | 8/1967 | Drop . |
| 3,487,226 | 12/1969 | Yetter et al. . |
| 3,622,396 | 11/1971 | Fernandez et al. . |
| 3,624,401 | 11/1971 | Stoller . |
| 3,876,877 | 4/1975 | Meulensteen et al. . |
| 4,092,719 | 5/1978 | Salmon . |
| 4,144,449 | 3/1979 | Funk et al. . |
| 4,151,945 | 5/1979 | Ragard et al. . |
| 4,247,767 | 1/1981 | O'Brien et al. . |
| 4,346,293 | 8/1982 | Fetzer . |
| 4,383,359 | 5/1983 | Suzuki et al. . |
| 4,615,093 | 10/1986 | Tews et al. . |
| 4,790,069 | 12/1988 | Maruyama et al. . |
| 4,805,110 | 2/1989 | Takahashi et al. . |
| 5,060,366 | 10/1991 | Asai et al. . |

FOREIGN PATENT DOCUMENTS

| | | |
|---|---|---|
| 416878 | 3/1991 | European Pat. Off. . |
| 4721272 | 2/1992 | European Pat. Off. . |
| 2834836 | 6/1979 | Germany . |
| 61-089951 | 9/1985 | Japan . |
| 2183820 | 6/1987 | United Kingdom .................. 356/375 |
| 9214988 | 9/1992 | WIPO . |
| WOA9214988 | 9/1992 | WIPO . |

*Primary Examiner*—F. L. Evans
*Attorney, Agent, or Firm*—Knobbe, Martens, Olson & Bear, LLP

[57] ABSTRACT

The invention is adapted to be embodied in a component measuring system for measuring a component in an optical detecting station. A pick up device is supported for movement in a first direction and is rotatable about an axis. An optical detection station having an optical range limited in height is defined by a plurality of parallel light rays. The pick up device moves a component held thereby into the optical range. The device measures at least one dimension of said first area of said component and determines whether this area was correctly measured.

22 Claims, 7 Drawing Sheets

COMPONENT MOUNTER AND RECOGNITION METHOD

BACKGROUND OF THE INVENTION

This invention relates to a method and apparatus for mounting components and more particularly to an improved method and apparatus for more precisely picking up components to be mounted on a substrate.

A wide variety of types of apparatus have been proposed for picking up small components such as integrated circuits, resistors or the like, and mounting these components at an accurate location on a substrate. The components are normally picked up by a pick-up device such as a vacuum pickup nozzle from a feeder station. When the components are picked up, their orientation relative to the pick-up device cannot be accurately controlled so as to insure precision mounting. Therefore, it has been proposed to provide various ways in which the orientation of the component, as picked up by the pick-up device, is determined, and then the mounting position is corrected to accommodate errors in the pick-up location.

The co-pending application of the inventor hereof, entitled "Method For Mounting Components And An Apparatus Therefor," Ser. No. 08/073,741, filed Jun. 8, 1993, and assigned to the assignee hereof now issued as U.S. Pat. No. 5,384,956 on Jan. 31, 1995, discloses a method whereby optically it is possible to determine the orientation of a component picked up by the pick-up device by rotating the component and measuring the projected length of the component in two (2) angular positions. From these measurements, the actual location of the component can accurately be determined and the corrective factors calculated.

Typically, the optical detector will raise components to a pre-determined recognition height. Unfortunately, not all components are shaped such that an accurate determination of the component location can not be determined at the same recognition height. In addition, the parameters measured to determine the location of the component may include noise. Such noise may result from debris, loose wires or, even, a polished portion of the component itself causing the light beams to be reflected in a misleading manner. As a result of these difficulties properly picked up components may be discarded and improperly picked up components may be improperly mounted.

SUMMARY OF THE INVENTION

The invention is adapted to be embodied in a component measuring system for measuring a component in an optical detecting station. A pick up device is supported for movement in a first direction and is rotatable about an axis. An optical detection station having an optical range limited in height is defined by a plurality of parallel light rays. The pick up device moves a component held thereby into the optical range. The device measures at least one dimension of said first area of said component and determines whether this area was correctly measured. If not, means are provided for moving said pick up device in said first direction for placing a second area of said component in said detection station's range.

DETAILED DESCRIPTION OF THE PREFERRED EMBODIMENT OF THE INVENTION

Figure 1:
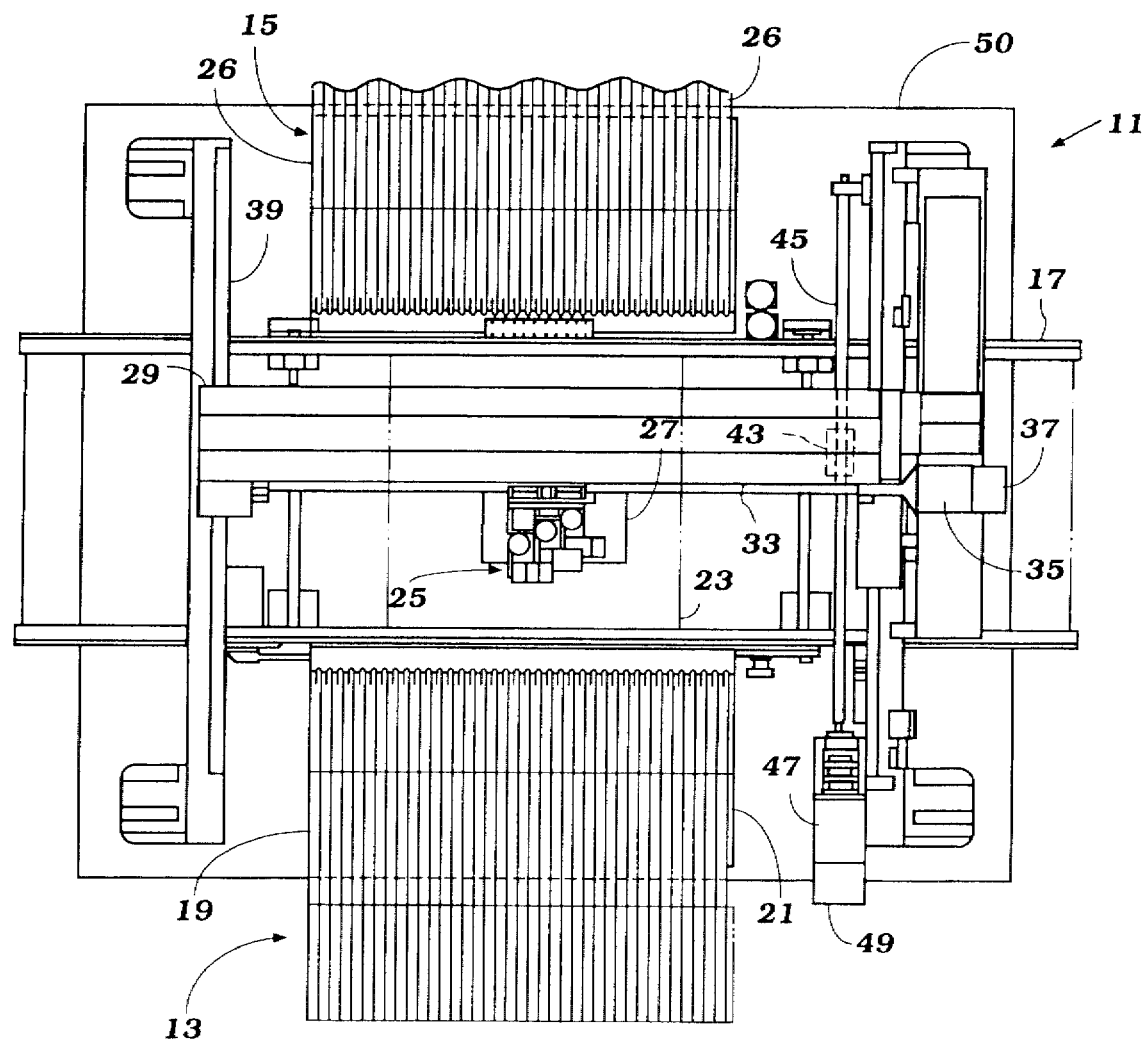
FIG. 1 is a top plan view of a component mounting apparatus constructed in accordance with an embodiment of the invention.
Figure 2:
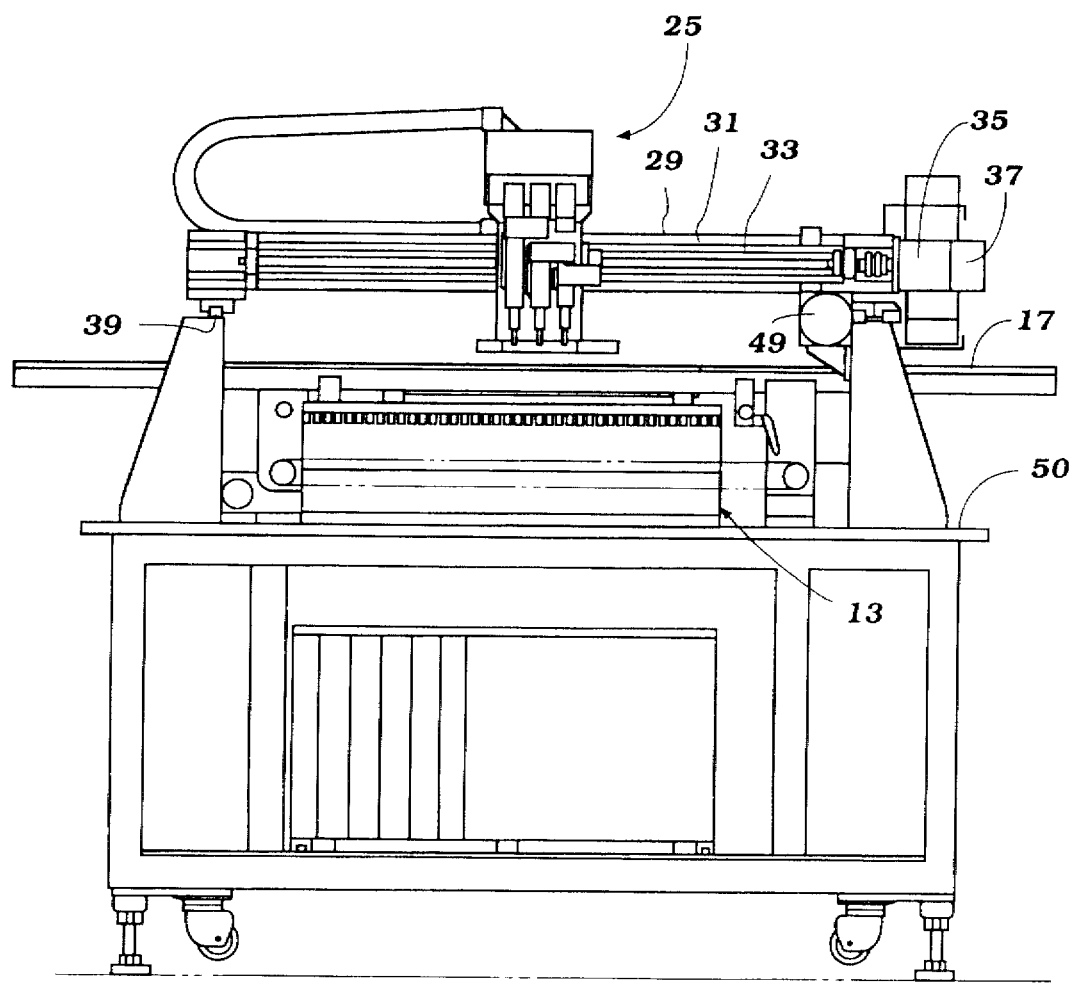
FIG. 2 is a front elevational view of the component mounting apparatus of FIG. 1.

Referring now in detail to the drawings and initially to FIGS. 1 and 2, a component mounting apparatus constructed and operated in accordance with the preferred embodiment of the invention is identified generally by the reference numeral 11. The apparatus 11 is adapted to mount small components such as integrated circuits, resistors, capacitors or the like which are supplied at respective delivery stations 13 and 15 disposed on opposite sides of a conveyor assembly 17. The delivery stations 13 and 15 comprise a plurality of individual feeders 19 and 21, each of the type comprising a roll of tape having pockets in which components to be mounted are contained. These tapes are advanced by a ratchet mechanism under a control as is well known.

The conveyor 17 selectively presents a substrate, indicated at 23, to a mounting area positioned between the delivery stations 13 and 15. A pick-up and recognition device, indicated generally by the reference numeral 25, is mounted for movement in an X-Y plane so as to selectively pick up components from the feeders 19 and 21 and position them on the substrate 23 at the desired location. In addition, the pick-up and recognition device 25 cooperates so as to provide an indication of the orientation of the components picked up thereby so as to adjust for their mounting position, as will be described.

The pick-up and recognition device 25 includes a mounting head 27 which is mounted for movement along a carriage 29 by means of guide rails 31 and a driving feed screw 33. The feed screw 33 has a ball mount connection with the mounting head 27 so that upon rotation of the feed screw 33, the mounting head 27 will move in the X axis direction.

An X axis drive motor 35 is mounted at one end of the carriage 29 and is coupled to the feed screw 33 for driving in clockwise or counter clockwise directions so as to appropriately position the mounting head 29. An encoder 37 is coupled to the X axis drive motor 35 and provides an X coordinate positional signal to a control apparatus as shown in the block diagram of FIG. 4.

The carriage 29 is mounted for movement in the Y direction on a pair of guide rails 39 which are disposed at opposite sides of an area where the substrate or printed circuit boards 23 are disposed and outwardly of the ends of the feeder sections 13 and 15. It will be appreciated that this arrangement permits movement of the carriage 29 along the guide rails 39.

Figure 4:
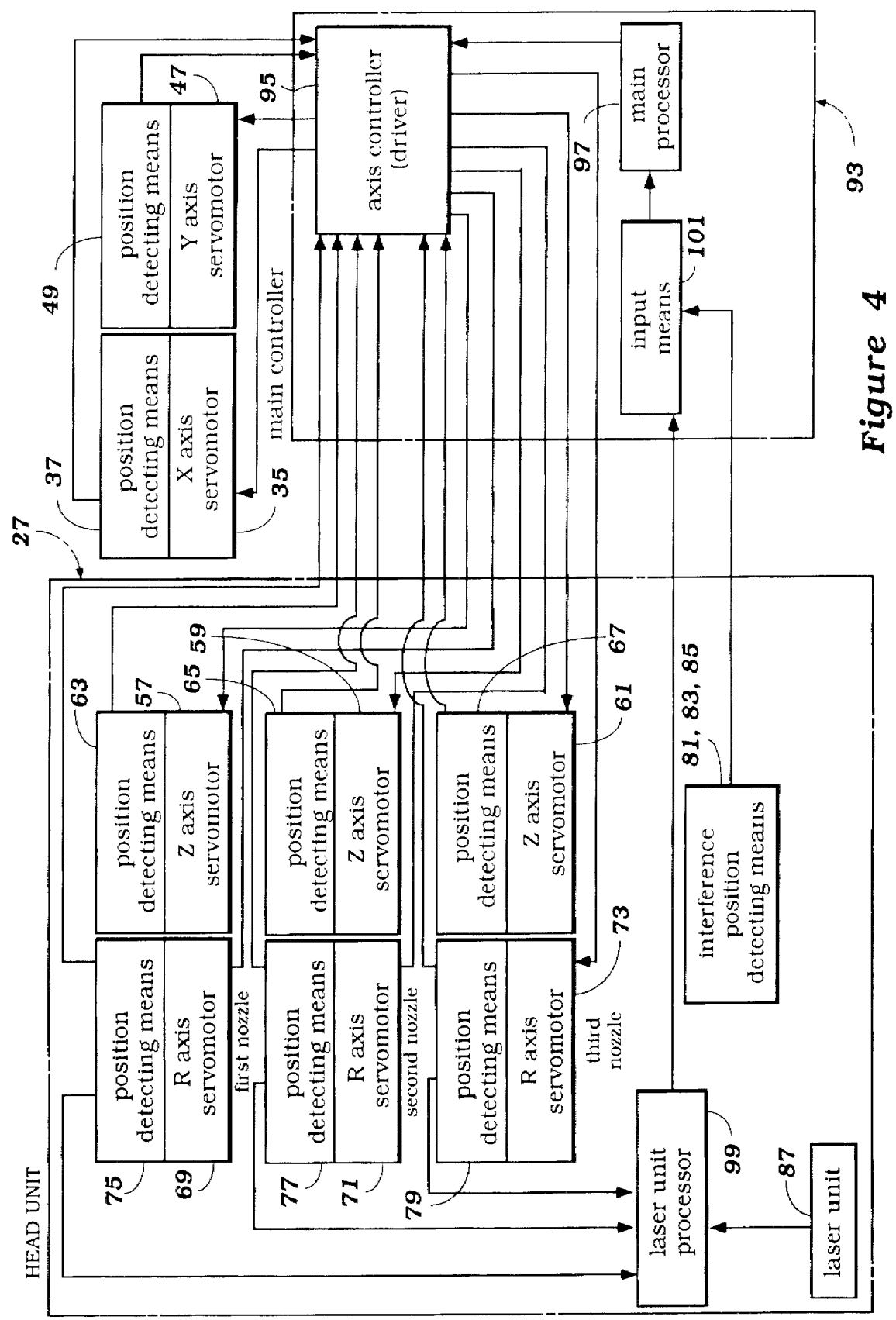
FIG. 4 is a block diagram showing the interrelationship between the various components of the preferred embodiment of the invention.

The carriage 29 is provided with a recirculating ball nut 43 which is engaged with a feed screw 45 that is journaled on one of the guide rails 39. This feed screw 45 is driven by a reversible electric motor 47 so as to move the carriage 29 and mounting head 27 in the Y direction. An encoder 49 is coupled to the Y-axis drive motor 47 and, as shown in FIG. 4, provides an output signal indicative of the Y coordinate position of the mounting head 27.

The entire assembly as thus far described may be mounted conveniently on a table 50 so that the apparatus can be moved from location to location, but can also be retained in position.

Figure 3:
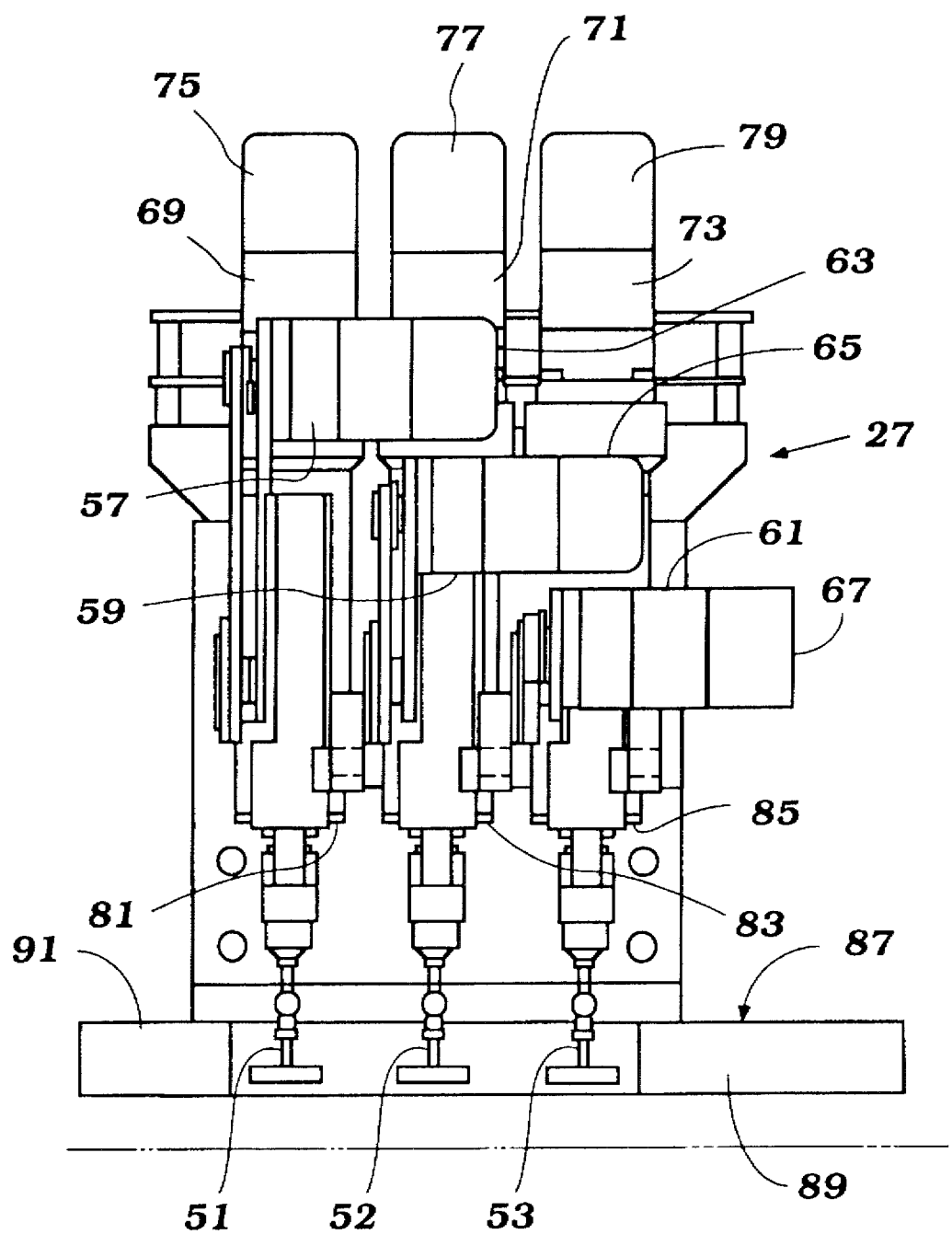
FIG. 3 is an enlarged front elevational view showing the detecting station of FIG. 1.

The construction of the pick-up and recognition device 25 will now be made by reference to FIG. 3. Referring to FIG. 3, it should be noted that the mounting head 27 carries, in this embodiment, three pick-up nozzles indicated by the reference numerals 51, 53 and 55. The pick-up nozzles 51, 53 and 55 are of the vacuum-type, but it should be readily apparent to those skilled in the art that the invention can be employed with other types of pick-up nozzles. Reference is made to the co-pending application filed in the name of the inventor hereof, entitled "Method for Mounting Components and An Apparatus Therefor", Ser. No. 08/086,512, filed Jul. 1, 1993, and assigned to the Assignee hereof now issued as U.S. Pat. No. 5,377,405 on Jan. 3, 1995, for a more detailed description of how the plural pick-up nozzles may be mounted on a single mounting head. The disclosure of that application is incorporated herein by reference.

Briefly summarized, each of the pick-up nozzles 51, 53 and 55 is mounted for movement in a vertical direction along a Z axis by the mounting head 27 and is driven for movement in such direction by a respective Z axis servo motor 57, 59 and 61. Encoders 63, 65 and 67 are coupled to the drive motors 57, 59 and 61, respectively, so as to provide an output signal indicative of the Z coordinate position of the respective nozzles 51, 53 and 55, as shown in FIG. 4.

In addition, the nozzles 51, 53 and 55 are also supported for a rotation about vertical R axis in a manner described in the aforementioned co-pending application Ser. No. 08/086,512. Rotational movement about these axes is obtained by R axis servo motors 69, 71 and 73, which are coupled to nozzles 51, 53 and 55, respectively, for affecting rotary movement. Encoders 75, 77 and 79 are connected to the motors 75, 77 and 79, respectively, and provide output signals indicative of the angular position about the rotational R axis. Again, the relationship of these components is shown in FIG. 4.

The mounting head 27 of the pick-up and recognition device 25 also detects the position of components which are picked up by the pick-up nozzles 51, 53 and 55, so as to make correction factors for misalignment of their pick-up from their position so that when they are positioned on the substrate 23 they will be positioned in an accurate location.

The respective pick-up nozzles 51, 53 and 55 are each provided with an interference position detector 81, 83 and 85, respectively, for detecting the position of the pick-up nozzle in relation to the delivery stations 13 and 15. As discussed below, the respective interference position detectors 81, 83 and 85 determines if its pick-up nozzle 51, 53 and 55 has been elevated sufficiently clear from the individual feeder 19 or 21 so as to begin movement of the mounting head 27.

A vacuum source (not shown) is connected to the pick-up nozzles 51, 53 and 55 by way of a valve or the like to apply vacuum to the nozzles when required to pick up chip components.

The pick-up and recognition device 25 also insures that the position of the components after being picked up is detected to enable correction factors for misalignment from an ideal position to be calculated to enable them to be positioned in an accurate location.

For simplicity, the apparatus 11 of the present invention is described in connection with an optical detector comprising a laser unit 87. It will be appreciated, however, that the present invention will be applicable when other forms of detectors are utilized. The laser unit 87 includes two primary components, a laser light source 89 and a laser light detector 89 facing one another on both sides of the pick-up nozzles. As will be appreciated from FIG. 1, the pick-up nozzles 51, 53 and 55 are located to avoid overlapping of the pick-up nozzles in the direction of the casting laser beams. Thus, while the laser unit 89 is oriented so that the laser beams are cast in the X direction, the pick-up nozzles are obliquely staggered with respect to the X-axis, so that images of the nozzles are projected on different areas of the detector of the laser unit. It should be noted that while chip components are usually picked up as shown in FIG. 3, with one component for each pick-up nozzle, a relatively large chip component will be picked up by the pick-up nozzle 53 in the center only, or by the pickup nozzles 51 and 55 on both sides only. Thus, the pick-up nozzles 51, 53 and 55 are suitably selected according to the sizes of the chip components to be picked up.

FIG. 4 illustrates the apparatus 11 schematically for purposes of illustrating the interrelationship of the components for control purposes. The apparatus 11 includes a main controller 93 which has an axis controller or axis driver which controls the operation of the X-axis servo motor, the Y-axis servo motor, the Z-axis servo motors, and the R-axis servo motors associated with the first, second and third pick-ups nozzles, respectively. This axis driver controller also receives back signals from the various encoders or position detectors associated with the aforenoted servo motors.

The axis controller driver unit receives its signals from a main processor 97 so as to effect movement in accordance with the procedures which will be described herein and also the procedures described in each of the three (3) co-pending applications which deal primarily with the movement for pick-up and mounting and the specific recognition techniques employed therein.

The main processor 97 directs automatic pick-up and mounting of chip components according to a program preset determined by the type of circuit board on which the chip components are to be mounted. The main processor 97 recognizes the components by means of operation of the axis controller through use of the servo motors, thereby detecting the projected width of the picked up chip components. The main processor 97 also determines mounting position correction amounts for the individual chip components based on the signals issued by a laser unit processor 99 through an input device 101, which in turn are based on signals representing projected chip components widths detected by the laser unit. This information is then utilized by the axis controller 95 to perform the correct positioning of the head 27 by the axis controller 95.

Figure 5:
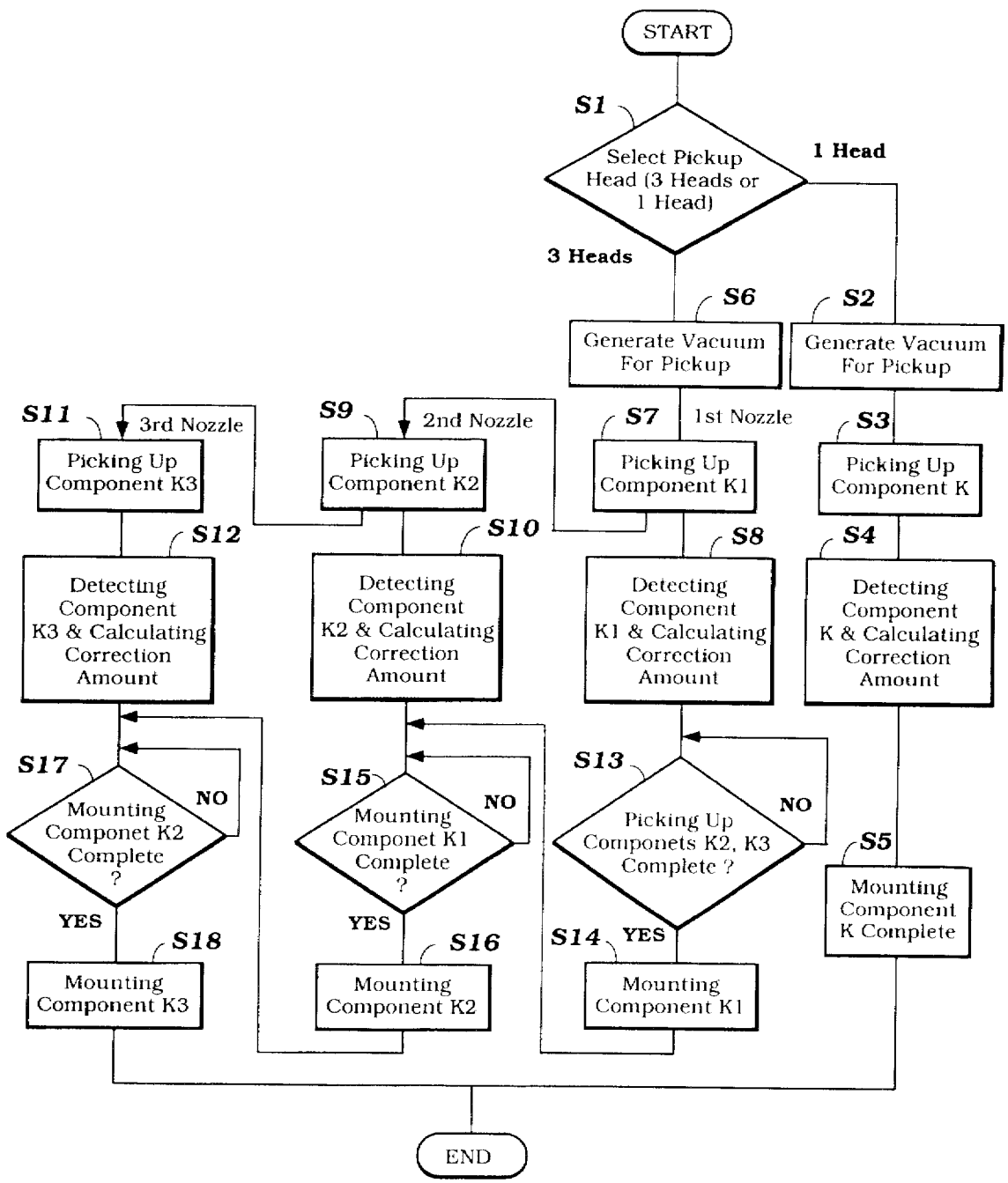
FIG. 5 is a block diagram showing a control routine in accordance with the method of the present invention.

The manner in which the main controller 93 operates will now be described in greater detail, with reference to FIG. 5. While the preferred embodiment utilizes three pick-up nozzles, as discussed above, depending upon the size of the chip components, the apparatus may utilize one, two or three pick-ups nozzles. Accordingly, the flow chart of FIG. 5 discusses selective use of either one or three pick-up nozzles.

After the start of the subroutine, at step S1, a decision is made as to the desired number of pick-up heads to be utilized (either three nozzles or one nozzle) based on the size of the component. When a single nozzle is selected in step 1, the process proceeds to step 2. In step 2, the vacuum is applied from a vacuum source (not shown) to one of the three pick-up nozzles, and the head 27 is moved in the X-axis and Y-axis directions toward the pick-up location. When the head 27 reaches the pick-up location corresponding to the desired individual feeder, the pick-up nozzle is lowered and an intended chip component K is picked up (step S3).

When the pick-up of the chip component K is complete, the pick-up nozzle is raised, and the head 27 is moved to the printed circuit board to mount the chip component K. During movement of the head 27, the chip component K is recognized by the laser unit 87 and the correction value for the component mounting position is calculated based on the detected data (step 54). Accordingly, when the head 27 reaches the position corrected by the correction value, the pick-up nozzle is lowered with a simultaneous stop of the application of vacuum to the pick-up nozzle and the mounting of the chip component K to the printed circuit board, thus completing the mounting process (step S5).

Alternatively, when the size of the components are such that the mounting operation utilizes all three pick-up nozzles, based on the decision process of step 1, the process proceeds to step S7. The pick-up, recognition and mounting process of each of the three pick-up nozzles takes place in parallel, but is impacted by the process of the other nozzles.

Once the determination is made that three nozzles will be used, vacuum is applied to each of the three pick-up nozzles in step S6, and the head is immediately moved to the component supply section. During this process, the first nozzle is lowered and an intended chip component K1 is picked up (as 7). When the pick-up of the chip component K1 by the first pick-up nozzle is complete, the unit is immediately moved to enable the second pick-up nozzle to pick up a chip component. During the movement of the head towards the subject feeder to pick up the intended chip component K2, the apparatus performs the recognition technique on component K1 picked up by the first pick-up nozzle and begins to calculate the appropriate correction amounts (step S8), as will be discussed in greater detail below. When the head reaches the appropriate position above the desired feeder for the second nozzle, the second pick-up nozzle lowers and picks up the intended chip component K2 (step S9).

When the pick-up of the chip component K2 by the second pick-up nozzle is complete, the head immediately moves toward the chip pick-up location for the third pick-up nozzle. During this process, the apparatus is performing the component recognition process and to calculate the appropriate correction amounts for the chip component K2 picked up by the second pick-up nozzle (step S10). When the head reaches a position above the feeder corresponding to the third pick-up nozzle pick-up position, the third pick-up nozzle lowers and picks up the intended chip component K3 (step S11).

When pick-up of the chip component K3 by the third pick-up nozzle is complete, the apparatus proceeds with the component recognition process for the chip component K3 picked up by the third pick-up nozzle (step S12).

Immediately after step 8, the apparatus checks to determine whether components K2 and K3 have been picked up by the apparatus (step S13). If not, this portion of the program repeats until this process is completed. However, if the pick-up of components K2 and K3 is complete, then the mounting of chip component K1 commences (step S14). Specifically, the head unit is moved to the position on the printed circuit board dictated by the correction amount for mounting the chip component K1. When the head reaches the intended position, the first pick-up nozzle lowers while vacuum is gradually weakened so the chip component K1 is mounted on the printed circuit board. Then the process proceeds to step S15.

In a manner similar to the control loop of the subroutine of the first pick-up nozzle, the second pick-up nozzle determines whether the mounting of component K1 has been completed (step S15). If not, the program repeats until the mounting of component K1 is indicated to have been completed. When the mounting of component K1 is determined to have been completed, the chip component K2 is mounted and thereafter proceeds to step S17.

Similarly, in step S17, the subroutine inquires as to whether the component K2 has been mounted, and if not, it repeats until the inquiry is answered in the affirmative. Once the question is answered affirmatively, the process proceeds to step S18 and the component K3 is mounted.

Figure 6:
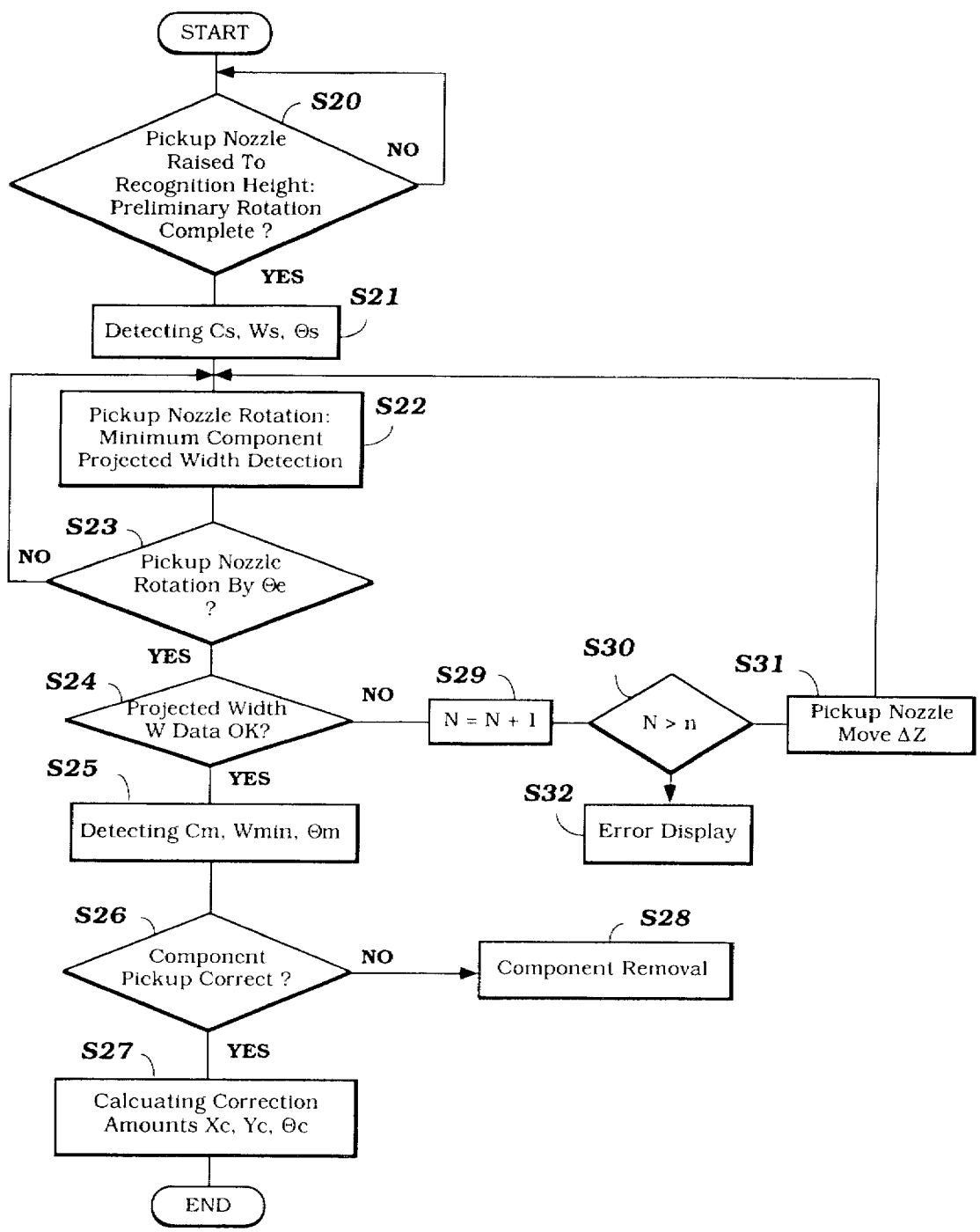
FIG. 6 is a block diagram showing another aspect of the control routine of the mounting apparatus of the present invention.

As discussed above, the foregoing process incorporates the step of modifying the mounting location for each component. This modification process will now be described in greater detail with reference to the flow chart of FIG. 6. Specifically, this modification of the mounting location occurs at the time of component recognition (steps S4, S8, S10 and S12), indicated on the block diagram of FIG. 5. For simplicity, the following description assumes that the initial decision (step S1) in the process of FIG. 5 was to utilize three pick-up nozzles and that the shape of the chip component is rectangular.

Figure 7:
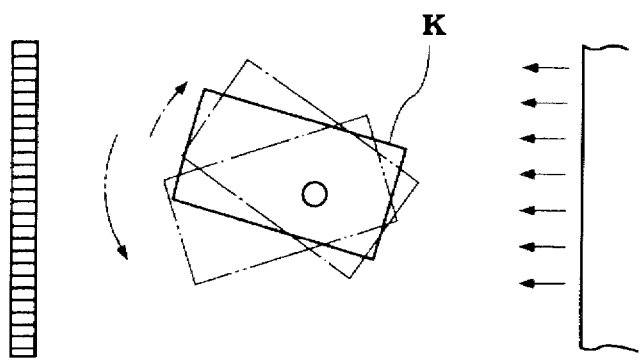
FIG. 7 is a schematic top view of a picked up component indicating the manner in which the orientation of the picked up component is determined.

When the chip component is picked up by the first nozzle from the component supply section, the chip component is typically raised to a specified height for recognition, and rotated by a specified angle with respect to the direction of the laser beam (X-axis direction) of the laser unit. This places the chip component in an initial position with its longer side tilted relative to the direction of the laser beam on the laser unit. More specifically, as shown in FIG. 7, the chip component K (shown in solid lines) is picked up by the first pick up nozzle 51 and is raised towards a recognition height where it will interfere with the laser beams transmitted by the laser light source 89 toward the laser light detector 91, so as to cast a shadow on the detector 91. The nozzle 51 begins turning in a negative (clockwise in FIG. 7) direction toward a certain angular position $\theta_s$ (shown in phantom).

At the beginning of the subroutine, at step S20, a determination is made as to whether the nozzle has been raised to the specified recognition height and the preliminary rotation to the $\theta_s$ position has been completed. If not, the program repeats.

If, on the other hand, the component has been raised to its recognition height and the preliminary rotation has been completed, the process proceeds to step S21 in which the chip component is placed in the initial position and its projected width $W_o$, central position $C_v$ and rotary angle $\theta_s$ are determined.

Figure 8:
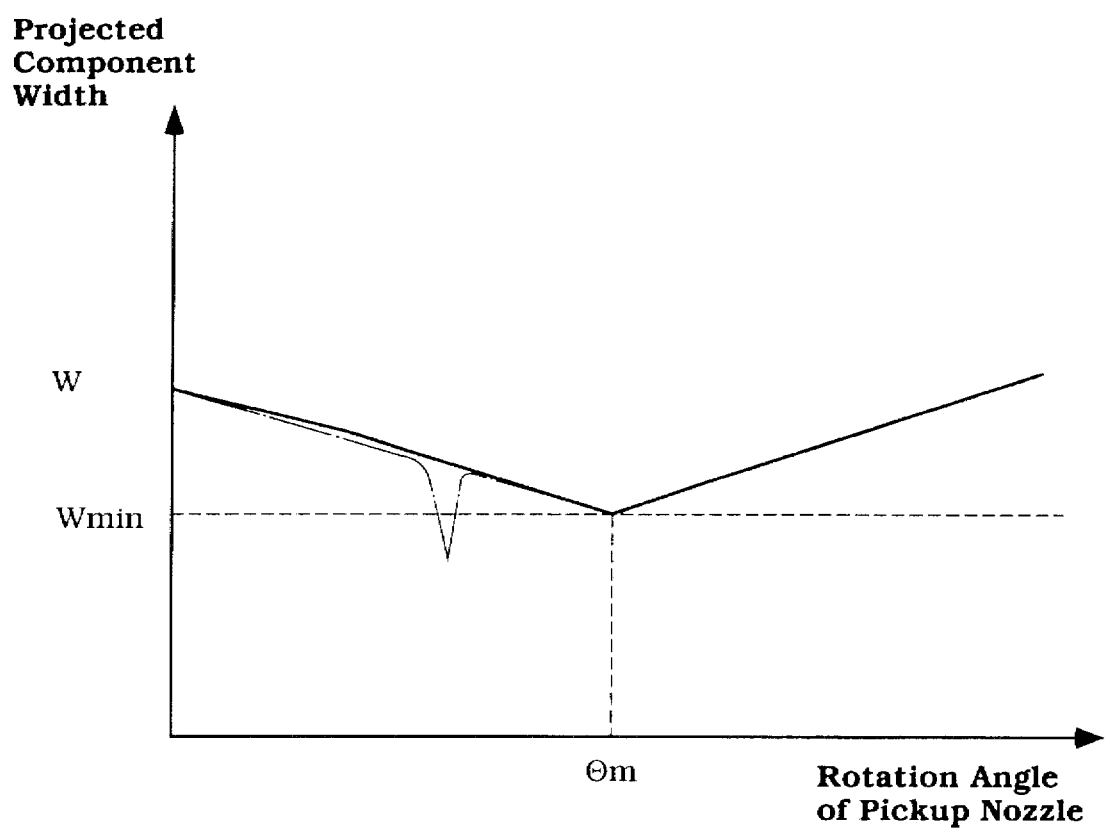
FIG. 8 is a graphical view showing how the width of the component varies during the rotational steps indicated in FIG. 7.

When this determination is completed, the nozzle is rotated in the opposite direction and the program begins to measure the component projected width (Step S22). This measurement is repeated until the program determines that the nozzle has rotated from the initial position by a specified angle of $\theta_e$ to avoid errors in the determination (step S23). As shown in FIG. 9, the projected width W varies according to the rotation angle $\theta$ and will define a minimum at a particular angle. Once the program determines that a rotation $\theta_e$ has occurred, the program determines whether the characteristics of the manner in which the projected widths W of the component K measured by the apparatus vary is appropriate (step S24). Specifically, the program determines whether the projected width W gradually decreases in the course of the rotation of the nozzle, and then increases, as shown in FIG. 8. If the projected width varies in the appropriate manner, the program determines the minimum projected width $W_{min}$, the central position $C_m$, and the rotary angle $\theta_m$ of the component (step S25).

Once these values are determined, the program utilizes these values to determine whether the chip component has been picked up correctly (step S26). If so, the component has been picked up normally, the process proceeds to step 27 in which the mounting position correction amounts $X_c$, $Y_c$ and $\theta_c$ are calculated for the directions X, Y and $\theta$. That is, in step 27, the length of the shorter side, displacement of the component central position in the shorter side direction of the chip component, and the rotary angle displacement are obtained from the minimum projected width $W_{min}$, central position $C_m$ and rotary angle $\theta$. From these and other data, the length of the longer side, and the displacement of the component central position in the longer side direction are obtained. From these results, the mounting position correction amounts $X_c$, $Y_c$ and $\theta_c$ are calculated. This process is set forth in greater detail in U.S. patent application Ser. No. 08/073,741, now Pat. No. 5,384,956 previously incorporated herein by reference. Once these correction factors are determined, this portion of the control program terminates and the component is mounted pursuant to the control sequence set forth in connection with FIG. 5.

If, after measuring the minimum projected width $W_{min}$, central position $C_m$ and rotary angle $\theta$, the program determines that the component has not been picked up correctly, the process proceeds to step S27 and the chip component is removed. Again, this terminates this portion of the control sequence and the apparatus proceeds in accordance with the control sequence set forth in connection with FIG. 5.

Referring again to step 24, if the program determines that the manner in which the projected width W varies is not appropriate, such as in the case where the data shows minimum values at multiple points (as shown in phantom in FIG. 8), the program proceeds to a counter step (step S29) to keep track of the number of recognition errors. The program then compares the number in the counter to a preselected error number (step S30). If the error is not above the preselected error number, the pick up nozzle is rotated in the negative direction to reset the chip component in the original position and the pickup nozzle 51 is then raised or lowered relative to the specified recognition height Z by a small distance $\Delta Z$ (step 31). The program then returns to step S22, in which the projected width of the component is again measured. If, when the program again sequences through to step 24, and the characteristics of the projected width data are determined to be appropriate, the program advances to step S25 with the calculation of the minimum projected width $W_{min}$, central position $C_m$ and rotary angle $\theta$.

If, on the other hand, the characteristics of the variation in the projected width W are again inappropiate, the program once again proceeds to the counter step S29. Eventually, if the value in the error counter increases above the preselected error number, an error display or alarm is activated (step S32).

As will be appreciated, the method and the apparatus decribed above, is particularly adapted to automatically correct errors in mounting position and to ensure that components are mounted with a high degree of acurracy. Further, this method may be used in conjunction with the method of improving mounting position accuracy disclosed in the co-pending application of Kenichi indo and Hitoshi Onodera entitled "Attracting Nozzle Control Apparatus For A Chip Component Mounting Machine," Ser. No. 08/148,699, filed Nov. 5, 1993, Attorney Docket No. 2503-02379 and assigned to the Assignee hereof, now issued as U.S. Pat. No. 5,467,186 on Nov. 14, 1995 which discloses improving mounting position accuracy by determining the type of component which has been picked up for purposes of setting the desired initial component recognition height. This application is hereby incorporated herein by reference.

Advantageously, the utilization of a repeated component recognition process after moving the component in an effort to avoid faulty readings, has the effect of improving the accuracy of the component placement, as well as reducing the number of chip components rejected as being defective.

Of course, the foregoing description is that of a preferred embodiment of the invention, and various changes and modifications may be made without departing from the spirit and scope of the claims.

I claim:

1. A component measuring system for recognizing a component in a detecting station comprising a pick up device supported for movement in a first direction, a detection station having a range limited in the first direction, means for moving said pick up device in said first direction into a first position wherein the component held thereby is moved into said detection station range, means for controlling movement in said first direction so that a first area of the component will be within the detection station range, an error detector for determining whether said detection station has correctly measured said first area in said detection station, and means for incrementally moving said pick up device in said first direction to a second position for placing a second area of said component in said detection station range and performing a second measurement upon said component if said first measurement was incorrect.

2. A component measuring system for measuring a component in a detecting station as set forth in claim 1 further comprising means for measuring at least one dimension of said second area of said component and means for determining whether said measuring means has correctly measured said second area.

3. A component measuring system for measuring a component in a detecting station as set forth in claim 2 wherein said error detector further comprises means for analyzing a series of projected dimension measurements.

4. A component measuring system for measuring a component in a detecting station as set forth in claim 2, further comprising means to release components improperly picked up by said pick-up device.

5. A component measuring system for measuring a component in a detecting station as set forth in claim 2 further comprising means for counting the number of areas of a component that are positioned within said range and measured.

6. A component measuring system for measuring a component in a detecting station as set forth in claim 5 further comprising means for determining when said means for counting has counted above a predetermined number and means for indicating when said means for determining has determined that said means for counting has counted above a predetermined number.

7. A component measuring system for measuring a component in a detecting station as set forth in claim 1 wherein said means for determining whether said detection station has correctly measured said first area comprises means for analyzing a series of projected dimension measurements.

8. A component measuring system for measuring a component in a detecting station as set forth in claim 7 wherein said projected dimension is width.

9. A component measuring system for measuring a component in a detecting station as set forth in claim 1 further comprising means for counting the number of areas of a component that are positioned within said optical range and measured.

10. A component measuring system for measuring a component in a detecting station as set forth in claim 9 further comprising means for determining when said means for counting has counted above a predetermined number and means for indicating when said means for determining has determined that said means for counting has counted above a predetermined number.

11. A method of more accurately mounting a component with an apparatus which picks up a component at a pick up station and deposits that component in a position at a deposit station and includes an optical detection station having an optical range limited in height, comprising the steps of picking up a component with said apparatus at a first location corresponding to a component delivery position; moving a first area of said component into a position within said optical range; measuring at least one dimension of said first area of said component; determining whether said first area has been correctly measured; and moving a second area of the component within the optical range and taking a second measurement if said first measurement was incorrect.

12. The method as set forth in claim 11 further comprising measuring at least one dimension of said second area of said component and determining whether said second area has been correctly measured.

13. The method as set forth in claim 11 further comprising the step of calculating a mounting location correction amount.

14. The method as set forth in claim 13 wherein said determining whether said dimension has been correctly measured comprises analyzing a series of projected dimension measurements.

15. The method as set forth in claim 13 further comprising counting the number of areas of a component which are positioned within said optical range and measured.

16. The method as set forth in claim 15 further comprising indicating when said number of areas of a component measured are above a predetermined number.

17. The method as set forth in claim 13 further comprising counting the number of times a component has been incorrectly measured.

18. The method as set forth in claim 15 further comprising indicating when the number of times a component has been incorrectly measured is above a predetermined number.

19. The method as set forth in claim 11 wherein said determining whether said dimension has been correctly measured comprises analyzing a series of projected dimension measurements and determining whether said series has minimums at plural points.

20. The method as set forth in claim 19 further comprising measuring at least one dimension of said second area of said component and determining whether said second area has been correctly measured.

21. The method as set forth in claim 20 further comprising the step of calculating a mounting location correction amount.

22. The method as set forth in claim 19 further comprising the step of calculating a mounting location correction amount.

* * * * *